MULTILAYER CIRCUIT BOARDS WITH PLATED THROUGH HOLES

Filed Dec. 30, 1963

INVENTOR.
S. Bert Krasnow
BY his attorneys
Howson and Howson

United States Patent Office 3,301,939

Patented Jan. 31, 1967

3,301,939
MULTILAYER CIRCUIT BOARDS WITH PLATED THROUGH HOLES

S. Bert Krasnow, Hartsdale, N.Y., assignor to Precision Circuits, Inc., New Rochelle, N.Y., a corporation of New York Filed Dec. 30, 1963, Ser. No. 334,361
5 Claims. (Cl. 174—68.5)

This invention relates to printed circuit boards and more particularly multilayer printed circuit boards and methods for manufacturing them.

A multilayer printed circuit board comprises a printed circuit which exists in three or more different layers with a substrate between each to electrically insulate one layer from another. Printed circuit boards with only outside layers of printed circuitry are not generally considered multilayer boards.

In prior art multilayer printed circuit boards, the printed circuits existing at each layer have often been connected into a single unitary printed circuit by drilling a plurality of holes through or partially through the board to expose certain of the inner layer printed circuit conductors. The conductors are exposed at their edges which form part of the hole wall. The hole wall has then been plated with a conducting material so as to electrically interconnect the various printed circuit layers with each other.

Though there are other techniques available for developing multilayer circuitry, plating through the hole has been found to be the only practical approach to a high density production oriented process. In the past, however, this technique has been subject to a major disadvantage. The butt type joint in the holes, at the junction of the inner circuit layers and the plating in the hole, has been found to be unreliable. When subjected to vibration stresses, shear stresses, thermal shocks due to the soldering and unsoldering of connections and to normal replacement and repair stresses these joints tend to rupture. Finding and repairing such breaks is difficult and time consuming, for they are not always visible to the naked eye. Thus, it is often desirable to replace the board rather than repair it. The prior art has not satisfactorily taught how to make these joints more reliable so they won't rutpure when stressed by the rugged conditions which today's equipment must be designed to withstand.

It is, therefore, one object of this invention to provide a multilayer printed circuit board which is more reliable than those of the prior art.

Another object is to provide a multilayer printed circuit board of the type in which the conductors of the several layers are connected by a conductive coating on the walls of holes penetrating the board, wherein the electrical interconnections between the inner layer conductors and the conductive material deposited on the walls of the holes will not rupture when subjected to severe stresses such as have heretofore caused failure.

Another object is to provide an improved method of manufacturing multilayer printed circuit boards.

Another object is to provide in multilayer printed circuit boards a more reliable interconnection between the inner layer conductors and the conductive material deposited on the walls of the holes.

Another object is to provide a multilayer printed circuit board with a lock-in structure which insures a tight mechanical and electrical joint between the conducting material deposited on the inner wall of the hole and the inner layer conductors.

Other objects and advantages will appear as the invention is described in connection with the accompanying drawing.

For the purposes of this description, "seeding" is used to describe the process of placing conductive material on a surface, such as for example, by plating of copper on the wall of a hole through a printed circuit board by chemical reactions or mechanical means. Seeding is a well known process, and normally produces a very thin base layer of conductive material about one micro-inch thick. It is used to form a micro-thin base on which a more substantial layer of conductive material may be deposited.

"Plating" refers to the process of placing conductive material on a surface by means of an electrical current, such as by electroplating. This process is used to build up a layer of practical thickness on top of the thin seeded layer. A plated layer is normally from about .0005–.004 inch thick.

The term "depositing" is used to describe, generally, the forming of a layer of material on a surface and includes seeding and then plating.

The drawing shows successively, the steps in the formation of a multilayer printed circuit board according to the invention.

Figure 1:
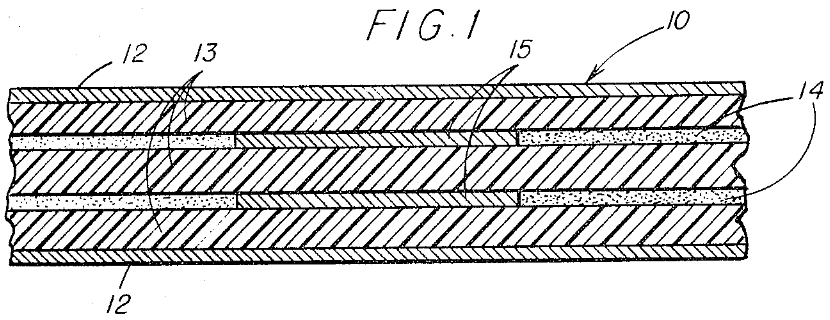
FIG. 1 is a vertical section view of a part of a conventional laminated multilayer printed circuit board.
Figure 2:
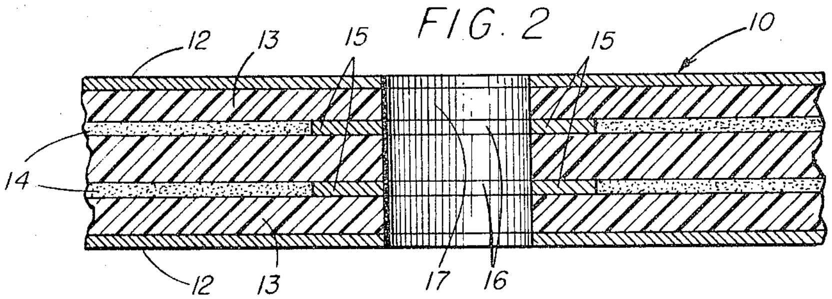
FIG. 2 is a view similar to FIG. 1 of the board after a hole has been formed through it intersecting the inner layer conductors.
Figure 3:
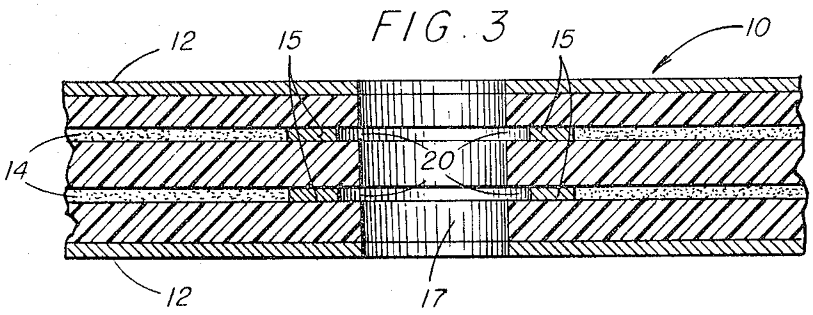
FIG. 3 is a view similar to FIGS. 1 and 2 of the board in which a portion of the inner layer conductors has been removed.
Figure 4:
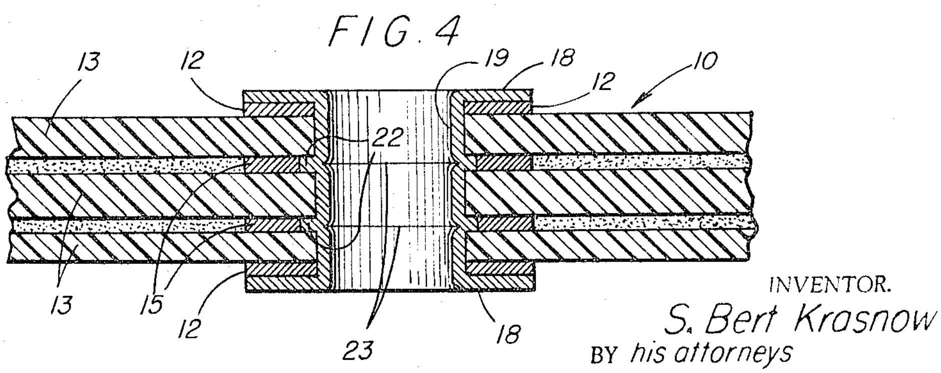
FIG. 4 is a view similar to FIG. 3 with metallic plating through the hole showing the interlock between the plating and the inner layer conductors.

Referring to FIG. 1, a conventional multilayer printed circuit board, designated generally by numeral 10, comprises a plurality of plates or substrate layers 13 made of any suitable insulating material, of which commercially available epoxy-glass composition sheets are only one example.

As is common in multilayer circuit boards, each layer 13 is a support for and has firmly adhered to one surface a thin layer or coating of conducting material 15 such as, for example, copper, nickel, gold, kovar or combinations or alloys of these or other metals, as is also common with multilayer circuit boards.

The insulation board layers 13 are adhered together by layers 14 of adhesive such as epoxy resin glue or other adhesive commonly used in securing together the laminations of a multilayer printed circuit board.

The configuration of the circuitry of at least the inner conductive layers 15 will have been formed in usual fashion, as by etching away unwanted portions for example, prior to adhering the layers 15 together. The configuration of the circuitry of the outer conductive layer may have also been done prior to gluing the insulation layers together or may be done later, as conditions indicate the preference.

Having glued together the several insulation plates 13 each with its conductive layer thereon and thus formed the laminated or multilayer circuit board, holes 17 are drilled or otherwise formed through the several layers of the board in position to pass through conducting layers which it is desired to electrically connect on the insulation plates.

In order to provide a stronger, more rugged electrical and mechanical connection between the conductive layers recesses 20 are formed in the wall of the hole in the zones or planes 16 of the conductive layers. Such recesses may be completely or only partially annular and may be formed chemically by etching or mechanically by chipping or grinding away the exposed edges 16 of the holes formed in the conductive layers. Such exposed edges will be complete circles when the hole area is less than the area of the conductive layer penetrated by the hole; or the exposed edges may be less than a complete circle if the hole is inaccurately drilled or formed or if the hole is purposely or necessarily formed adjacent an edge of the conductive layer or the edge of a circuit configuration thereon.

To prepare the wall of the hole in the insulation layers for electrically conductive plating the wall of the hole is seeded with a microthin layer of copper (not visible in the drawings) by chemical or mechanical deposition, such layer is about one microinch thick. It covers all exposed surfaces of the hole and particularly the shoulders of the recess and the edges of the insulation layers. On the seeded surfaces a thicker layer approximately .0005–.004 inch thick of copper is electroplated to interconnect the conductive printed circuit layers.

The result of this electroplating of the hole is the formation of a spool-shaped coating structure having radially extending flange portions 18 overlying the outer surfaces of the conductive layers 12 and physically and electrically united thereto by reason of having been electroplated thereon. The cylindrical portion 19 has integral radial annular ribs or rings 22 extending into the previously formed recesses in the hole wall and physically and electrically united with the edges of the conductive layers 15. Crease-like inward annular depressions 23 are formed in the surface of said cylindrical portion 19 during the electroplating, as the plating fills the previously formed recesses; but they have no undesirable effects.

It will thus be seen that etching, chipping or otherwise forming of the recesses in the hole wall, in the zones or planes of the conductive layers provides shouldered offset spaces which the plating metal fills, thereby providing the rings 22 around the cylindrical plating wall which can be supported on top and bottom by the shoulders of the offset spaces as well as by their electrical and mechanical bonding to the conductive layers. The additional support afforded by the rings and shoulders strengthens the connection between the conductive layers to such an extent that such connections do not break or fail under the shear and vibratory stresses which routinely heretofore have caused a breakdown of plated connections between the conductive layers.

It will be understood that various changes in the details, materials, steps and arrangements of parts which have been herein described and illustrated, may be made by those skilled in the art within the scope of the invention.

What I claim is:

1. A multilayer printed circuit board comprising a plurality of layers of insulating material, a plurality of thin layers of conductive material at least one of which is between two insulating layers and is configured for a printed circuit, at least one hole penetrating all said insulating and conductive layers, the edges of all inner conductive layers being recessed radially outward from the hole, and plating on the wall of said hole, said plating having a flange in the plane of each interior conductive layer which is electrically and mechanically bonded to each such layer, while the opposite radially extending surfaces of the flange are supported by contiguous surfaces of said insulating layers.

2. A multilayer printed circuit board comprising a plurality of layers of insulating material, a plurality of thin layers of conductive material at least one of which is between two insulating layers and is configured for a printed circuit, at least one hole penetrating all said insulating and conductive layers, the edges of all inner conductive layers being recessed radially outward from the hole, and plating on the wall of said hole, said plating having a rib in the plane of each interior conductive layer which is electrically and mechanically bonded to each such layer while opposite side surfaces of said rib are supported by contiguous surfaces of said insulation layers.

3. A multilayer printed circuit board as claimed in claim 2, having at least one outside conductive layer and having an integral radial extension at at least one outside end of the plating overlying and electrically and mechanically bonded to an outside conductive layer.

4. A multilayer printed circuit board comprising a stack of at least two insulating sheets having desired printed circuit conductor configurations adhered thereto, said sheets being secured to each other to form said board with at least one outer conductor configuration and at least one inner conductor configuration embedded between said sheets, at least one hole penetrating through a sufficient number of said sheets at a predetermined location to intersect at least two of said conductor configurations in different layers, at least one of said intersected conductor configurations being an inner layer, a portion of each of said intersected inner conductor layers being recessed radially outwardly from said hole, and plating in said hole, said plating having a protruding portion extending radially outwardly from said hole in the plane of each of said inner intersected conductor layers and each of said portions being electrically and mechanically connected to the radially recessed inner intersected conductor configuration in its plane and being supported above and below by adjacent insulating sheets.

5. A multilayer board according to claim 4 wherein at least one hole penetrates through the board and said plating extends through said hole, and said protruding portion comprises an annular flange.

References Cited by the Examiner

UNITED STATES PATENTS 3,219,749 11/1965 Schuster et al. ______ 174—68.5

LEWIS H. MYERS, *Primary Examiner.*

DARRELL L. CLAY, *Examiner.*